(12) United States Patent
Shen et al.

(10) Patent No.: US 7,587,008 B2
(45) Date of Patent: Sep. 8, 2009

(54) DECODING ERROR CORRECTING CODES TRANSMITTED THROUGH MULTIPLE WIRE TWISTED PAIR CABLES WITH UNEVEN NOISE ON THE WIRES

(75) Inventors: Ba-Zhong Shen, Irvine, CA (US); Scott Richard Powell, Carlsbad, CA (US); Kelly Brian Cameron, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 587 days.

(21) Appl. No.: 11/172,551

(22) Filed: Jun. 30, 2005

(65) Prior Publication Data

US 2006/0045213 A1    Mar. 2, 2006

Related U.S. Application Data

(60) Provisional application No. 60/613,923, filed on Sep. 28, 2004, provisional application No. 60/627,452, filed on Nov. 12, 2004, provisional application No. 60/604,426, filed on Aug. 25, 2004, provisional application No. 60/655,312, filed on Feb. 23, 2005.

(51) Int. Cl.
    H04B 1/10    (2006.01)
    H04B 1/38    (2006.01)
(52) U.S. Cl. .................................. 375/349; 375/222
(58) Field of Classification Search ............ 375/262, 375/265, 267, 285, 341, 347, 349, 227, 222; 370/334, 342, 350
    See application file for complete search history.

(56) References Cited

U.S. PATENT DOCUMENTS 3,542,756 A    11/1970    Gallager
3,665,396 A    5/1972    Forney, Jr.
4,295,218 A    10/1981    Tanner (Continued)

FOREIGN PATENT DOCUMENTS

EP    0 449 327 A2    10/1991

OTHER PUBLICATIONS

Geoffrey J. Byers and Fambirai Takawira: "Non-binary and concatenated LDPC codes for multiple-antenna systems" IEEE Africon 2004, 0-7083-8605-1, pp. 83-88.

(Continued)

*Primary Examiner*—Khanh C Tran
(74) *Attorney, Agent, or Firm*—Garlick Harrison & Markison; Shayne X. Short (57) ABSTRACT

Decoding error correcting codes transmitted through multiple wire twisted pair cables with uneven noise on the wires. A novel approach is presented by which the metrics may be calculated for signals received over multi-wire (or alternatively referred to as multi-channel, and/or multi-path) communication channels to exploit an uneven distribution of noise among those wires for improved performance. In addition, this approach may also be performed in combination with employing an amplification factor to modify the metrics employed when performing ECC (Error Correcting Code) decoding. Moreover, when information is known concerning which 1 or more paths (e.g., wires) has an SNR that is different (e.g., lower in some cases) from the others, an even better adapted means of calculating the metrics associated with each of the paths (e.g., wires) may be employed to provide for improved performance with respect to iterative decoding processing of signals encoded using ECCs.

26 Claims, 6 Drawing Sheets

U.S. PATENT DOCUMENTS

| | | | |
|---|---|---|---|
| 6,430,233 | B1 | 8/2002 | Dillon et al. |
| 6,473,010 | B1 | 10/2002 | Vityaev et al. |
| 6,567,465 | B2 | 5/2003 | Goldstein et al. |
| 6,603,823 | B1 * | 8/2003 | Yellin et al. ............... 375/340 |
| 6,633,856 | B2 | 10/2003 | Richardson et al. |
| 6,967,598 | B2 * | 11/2005 | Mills ........................ 341/50 |
| 7,065,695 | B2 * | 6/2006 | Cameron et al. ............ 714/755 |
| 7,421,376 | B1 * | 9/2008 | Caruso et al. .............. 702/190 |
| 2003/0104788 | A1 | 6/2003 | Kim |

OTHER PUBLICATIONS

Byers G J et al: "Non-binary and concatenated LDPC codes for multiple-antenna systems" Proc. 7th Africon Conference, Gaborone, Botswana, vol. 1, Sep. 15, 2004, pp. 83-88, XP010780470, ISBN: 0-7803-8605-1, p. 84; figures 1, 2.

Zhang Zhi et al: "Low-density parity-check codes and high spectral efficiency modulaton" Proc. Personal, Indoor and Mobile Radio Communications 2003, vol. 1, Sep. 7, 2003, pp. 444-448, XP010681635, ISBN: 0-7803-7822-9, pp. 445-446.

Jones W: "10GBASE-T Tutorial Overview" Jan. 2003, XP002340260, abstract, 34 pages.

R. Gallager, Low-Density Parity-Check Codes, Cambridge, MA: MIT Press, 1963.

M. Luby, M. Mitzenmacher, M. A. Shokrollahi, D. A. Spielman, and V. Stemann, "Practical Loss-Resilient Codes", Proc. 29 th Symp. on Theory of Computing, 1997, pp. 150-159.

T. J. Richardson and R. L. Urbanke, "The capacity of low-density parity-check code under message-passing decoding," IEEE Trans. Inform. Theory, vol. 47, pp. 599-618, Feb. 2001.

I. Djurdjevic, J. Xu, K. Abdel-Ghaffar and S. Lin, "A Class of Low-Density Parity-Check Codes Constructed Based on Reed-Solomon Codes With Two Information Symbols," IEEE Communications Letter, vol. 7, No. 7, pp. 317-319, Jul. 2003.

* cited by examiner

DECODING ERROR CORRECTING CODES TRANSMITTED THROUGH MULTIPLE WIRE TWISTED PAIR CABLES WITH UNEVEN NOISE ON THE WIRES

CROSS REFERENCE TO RELATED PATENTS/PATENT APPLICATIONS

Provisional Priority Claims

The present U.S. Utility Patent Application claims priority pursuant to 35 U.S.C. § 119(e) to the following U.S. Provisional Patent Applications which are hereby incorporated herein by reference in their entirety and made part of the present U.S. Utility Patent Application for all purposes:

1 U.S. Provisional Application Ser. No. 60/613,923, entitled "Improving iterative decoding of Low-Density Parity Check (LDPC) code and LDPC coded modulation by altering initial metric," filed Tuesday, Sep. 28, 2004.

2. U.S. Provisional Application Ser. No. 60/627,452, entitled "Amplifying magnitude metric of received signal during iterative decoding of Low-Density Parity Check (LDPC) code and LDPC coded modulation," filed Friday, Nov. 12, 2004.

3. U.S. Provisional Application Ser. No. 60/604,426, entitled "Low-Density Parity Check (LDPC) coded 128 double square QAM constellation modulation and its set-partition and gray code labeling," filed Wednesday, Aug. 25, 2004.

4. U.S. Provisional Application Ser. No. 60/655,312, entitled "Decoding error correcting codes transmitted through multiple wire twisted pair cables with uneven noise on the wires," filed Wednesday, Feb. 23, 2005.

BACKGROUND OF THE INVENTION

1. Technical Field of the Invention

The invention relates generally to communication systems; and, more particularly, it relates to decoding of signals employed in such communication systems.

2. Description of Related Art

Data communication systems have been under continual development for many years. One such type of communication system that has been of significant interest lately is a communication system that employs iterative error correction codes. Of particular interest is a communication system that employs LDPC (Low Density Parity Check) code. Communications systems with iterative codes are often able to achieve lower bit error rates (BER) than alternative codes for a given signal to noise ratio (SNR).

A continual and primary directive in this area of development has been to try continually to lower the SNR required to achieve a given BER within a communication system. The ideal goal has been to try to reach Shannon's limit in a communication channel. Shannon's limit may be viewed as being the maximum achievable data rate to be used in a communication channel, having a particular SNR (Signal to Noise Ratio), that achieves error free transmission through the communication channel. In other words, the Shannon limit is the theoretical bound for channel capacity for a given modulation and code rate.

LDPC code has been shown to provide for excellent decoding performance that can approach the Shannon limit in some cases. For example, some LDPC decoders have been shown to come within 0.3 dB (decibels) from the theoretical Shannon limit. While this example was achieved using an irregular LDPC code of a length of one million, it nevertheless demonstrates the very promising application of LDPC codes within communication systems.

The use of LDPC coded signals continues to be explored within many newer application areas. For example, the use of LDPC coded signals has been of significant concern within the IEEE (Institute of Electrical & Electronics Engineers) P802.3an (10GBASE-T) Task Force. This IEEE P802.3an (10GBASE-T) Task Force has been created by the IEEE to develop and standardize a copper 10 Giga-bit Ethernet standard that operates over twisted pair cabling according the IEEE 802.3 CSMA/CD Ethernet protocols. Carrier Sense Multiple Access/Collision Detect (CSMA/CD) is the protocol for carrier transmission access in Ethernet networks. IEEE 802.3an (10GBASE-T) is an emerging standard for 10 Gbps (Giga-bits per second) Ethernet operation over 4 wire twisted pair cables. More public information is available concerning the IEEE P802.3an (10GBASE-T) Task Force at the following Internet address:

"http://www.ieee802.org/3/an/".

This high data rate provided in such applications is relatively close to the theoretical maximum rate possible over the worst case 100 meter cable. Near-capacity achieving error correction codes are required to enable 10 Gbps operation. The latency required by using traditional concatenated codes, simply preclude their use in such applications.

Clearly, there is a need in the art for some alternative coding type and modulation implementations that can provide near-capacity achieving error correction.

One such type of codes, of the possible codes that achieve very good performance that approaches the theoretical limits, is that that may be characterized as being LDPC codes. Such a code offers the combination of low latency and high coding gain necessary to enable 10GBASET Ethernet transceiver PHY (physical layer) products.

When considering a coding system that codes the binary information sequence to an LDPC codeword and then maps the LDPC codeword to constellation signals. These constellation signals may also be viewed as being modulation signals as well. A modulation may be viewed as being a particular constellation shape having a unique mapping of the constellation points included therein.

In a multi-path communication system (e.g., where the communication channel itself is composed of multiple wires, multiple channels, and/or multiple paths), it may be supposed that the channel noise of each wire, channel, and/or path can be modeled as being AWGN (Additive White Gaussian Noise) with noise variance, $\sigma^2$. This assumption is not restrictive since an optimal receiver will "whiten" non-AWGN in the channel such that the noise will closely approximate AWGN when seen by the LDPC decoder.

Then, upon receiving the symbol, y, the probability that the constellation signal, s, in the constellation was actually sent is provided as follows:

$$p_s(y \mid s) = \frac{1}{\sigma\sqrt{2\pi}} \exp\left(\frac{-1}{2\sigma^2} D_{SE}(y, s)\right) \quad \text{(EQ 1)}$$

where $D_{SE}(y,s)$ is the squared Euclidean distance between the transmitted signal, y, and the received signal, s, and $\sigma^2$ is the variance of the AWGN. The value of this probability, $p_s(y|s)$, may be referred to as the metric of the received signal, s. Based on this probability (or alternatively referred to as this metric), the MLD (Maximal Likelihood Decoding) approach tries all of the possible codewords with (EQ 1) for all possible symbols, s, and then the MLD approach finds the one codeword that has the maximal total probabilities. However, due to the inherent complexity of MLD approach, it is not possible with today's technology to carry out MLD when decoding LDPC coded signals or other such ECCs (Error Correcting Codes).

One of the sub-optimal decoding approaches (with respect to decoding LDPC coded signals or other such ECCs) is the iterative MP (Message Passing) (or BP (Belief Propagation)) decoding approach. In this MP (or BP) approach, the above provided (EQ 1) is used as a transition metric.

Moreover, in a practical realization of a communication system whose communication channel includes multiple wires, it is noted that the noise variance, $\sigma^2$, of each of the wires may differ significantly from one another. This difference in noise among each of the various and distinct components of the communication channel (e.g., wires, channels, and/or paths) presents a difficulty in calculating the value of this probability, $p_s(y|s)$, which again may be referred to as the metric of the received signal, s.

Clearly, there is a need in the art to provide for additional and improved means by which the varying degrees of noise within each of the multiple wires may be handled to provide for improved performance. A significant component of such a need lies in the calculation of the calculation of the probability, $p_s(y|s)$, which may be viewed as being the symbol metric of the received signal, s.

BRIEF SUMMARY OF THE INVENTION

The present invention is directed to apparatus and methods of operation that are further described in the following Brief Description of the Several Views of the Drawings, the Detailed Description of the Invention, and the claims. Other features and advantages of the present invention will become apparent from the following detailed description of the invention made with reference to the accompanying drawings.

DETAILED DESCRIPTION OF THE INVENTION

As also described above, upon receiving a symbol, y, from a communication channel having multiple paths (e.g., multiple wires), the probability that the constellation signal, s, in the constellation designated for that particular symbol was actually sent from a transmitter end of the communication channel to a receiver end of the communication channel may be provided as follows:

$$p_s(y \mid s) = \frac{1}{\sigma\sqrt{2\pi}} \exp\left(\frac{-1}{2\sigma^2} D_{SE}(y, s)\right) \quad \text{(EQ 1)}$$

where $D_{SE}(y,s)$ is the squared Euclidean distance between the transmitted signal, y, and the received signal, s, and $\sigma^2$ is the variance of the AWGN. The value of this probability, $p_s(y|s)$, may be referred to as the metric of the received signal, s.

One possible modification which has been presented to improve the decoding of the iterative MP (Message Passing) (or BP (Belief Propagation)) decoding approach is to replace the (EQ 1) presented above with the following (EQ 2).

$$p_s(y \mid s) = \frac{1}{\sigma\sqrt{2\pi}} \exp\left(\frac{-1}{2a\sigma^2} D_{SE}(y, s)\right) \quad \text{(EQ 2)}$$

where a represents the amplification factor.

Such approaches of employing this amplification factor, a, are disclosed in the U.S. Provisional Application Ser. No. 60/613,923 and the U.S. Provisional Application Ser. No. 60/627,452, which have been incorporated herein by reference in their entirety and made part of the present U.S. Utility Patent Application for all purposes, and also to which priority has been claimed, as indicated above.

As mentioned above, in a practical realization of a communication system whose communication channel includes multiple wires, it is noted that the variance of the noise, $\sigma^2$, of each of the wires may differ significantly from one another. Clearly, the standard deviation of the noise, $\sigma$, of each of the wires will then differ from one another. Given that there may such an uneven distribution of noise, even other alterations of the (EQ 2) may be performed to assist an LDPC decoder or some other ECC (Error Correcting Code) decoder to perform even better.

Herein, when one of the terms wires, paths, and/or channels is employed to describe the nature of a particular communication system, it is noted that the principles described therein may also be applied to channels, paths, and/or other components or parts of a communication channel. That is to say, any of the principles described herein may equally be applied and adapted to multiple path, multiple wire, and/or multiple channel communication systems.

Figure 1:
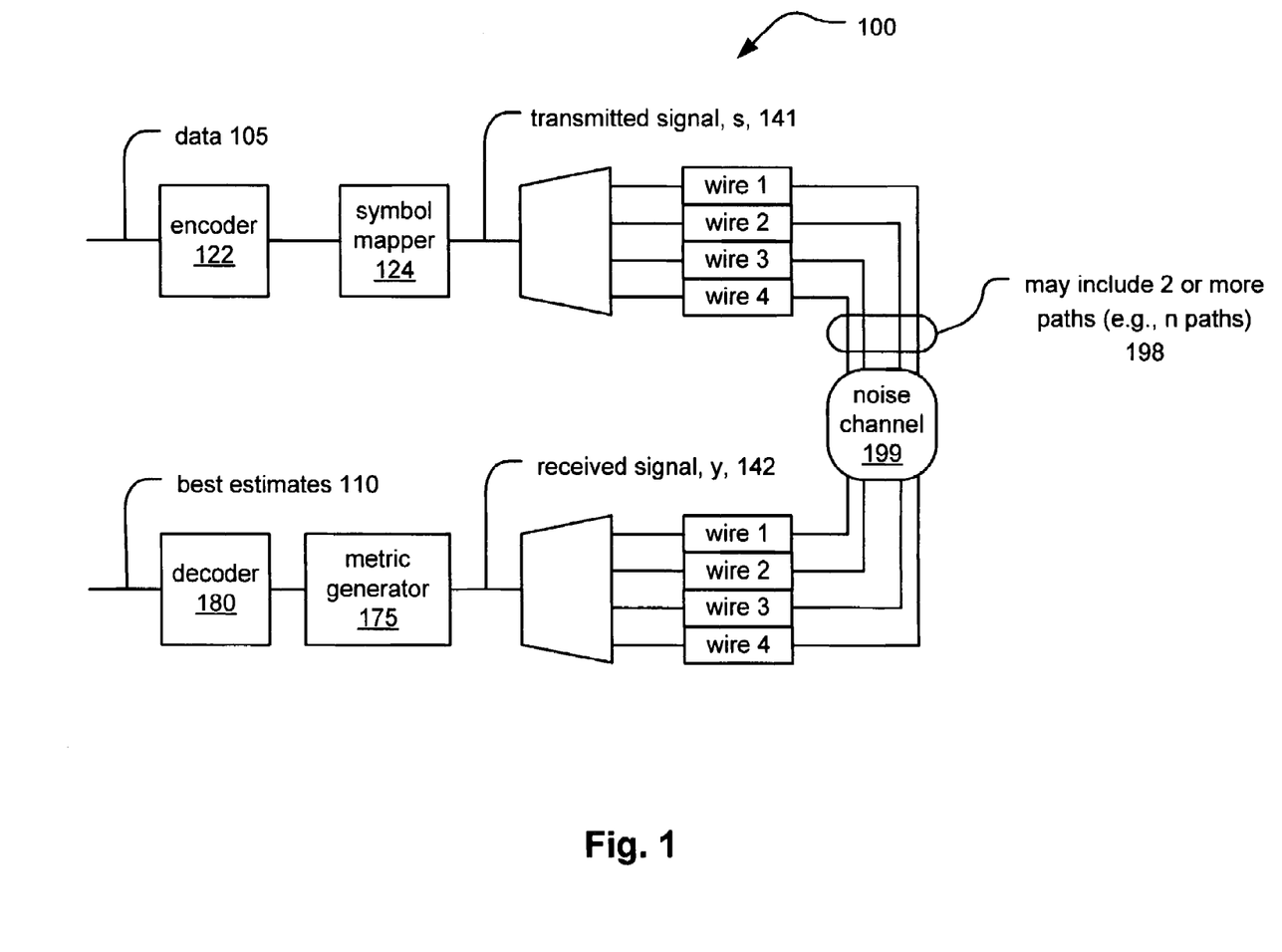
FIG. 1 is a diagram illustrating an embodiment of a communication system that may be built in accordance with certain aspects of the invention.

FIG. 1 is a diagram illustrating an embodiment of a communication system 100 that may be built in accordance with certain aspects of the invention. The communication system 100 is provided to show one possible embodiment of the partitioning of a communication channel (shown as noise channel 199) into a plurality of paths (e.g., such that the paths may be wires in one embodiment). This diagram explicitly shows the partitioning of the noise channel 199 into 4 paths such that each path is a wire. Therefore, the paths of the noise channel 199 wires are shown as a wire 1, a wire 2, a wire 3, and a wire 4. While this embodiment directly comports with the type of communication channel employed within the emerging standard, IEEE 802.3an (10GBASE-T) for 10 Gbps (Giga-bits per second) Ethernet operation over 4 wire twisted pair cables, it is noted that the principles presented herein are also applicable and may be implemented within communication systems whose communication channels have more or fewer wires as well without departing from the scope and spirit of the invention. For example, the communication channel may generally be characterized as to include 2 or more paths (e.g., n paths) as shown by reference numeral 198.

At the transmitter end of a communication channel, encoding of 1 or more information bits and/or data 105 is performed using an encoder 122 and a symbol mapper 124. This encoder 122 and the symbol mapper 124 may be implemented to support a wide variety of encoding and modulation schemes. For example, the communication device at the transmitter end of the communication channel may employ uncoded modulation, LDPC (Low Density Parity Check) encoding and modulation, TCM (Trellis Coded Modulation), turbo coding and modulation, or TTCM (Turbo Trellis Coded Modulation), among other types of encoding and modulation, as well as any other types of encodings and modulations that operate to counter the effects of lowered SNR (Signal to Noise Ratio) and potentially introduced ISI (Inter-Symbol Interference) that may occur to continuous-time transmit signal as it is transmitted across a communication channel having a number of paths and/or wires. Generally speaking, any type of ECC (Error Correcting Code) may be employed within the encoder 122 without departing from the scope and spirit of the invention. Care must then be taken to perform the decoding of the ECC at the receiver end of the communication channel to generate best estimates of the 1 or more information bits that have been encoded at the transmitter end of the communication channel.

After the information bits and/or the data 105 have been appropriately encoded using whichever encoding means is employed within a particular embodiment, the encoded information bits may be grouped to form symbols (and/or codewords) that may be symbol mapped according to any number of different types of modulations (where each modulation includes a constellation shape and unique corresponding mapping of the constellation points included therein).

After the information bits and/or the data 105 have been appropriately encoded (using the encoder 122) and symbol mapped (using the symbol mapper 124), a sequence of discrete-valued modulation symbols is output from within the symbol mapper 124. This sequence of discrete-valued modulation symbols is sometimes viewed as being a digital baseband signal. Sometimes, this digital baseband signal is separated as including each of the I, Q (In-phase, Quadrature) components for each symbol within the sequence of discrete-valued modulation symbols.

At the transmitter end of the communication channel shown in this embodiment, the sequence of discrete-valued modulation symbols may also be viewed as being discrete-time transmit signals. This sequence of discrete-valued modulation symbols (or the discrete-time transmit signals) are then provided to a transmit driver that is operable to comport the sequence of discrete-valued modulation symbols into an appropriate signal that may be launched into the communication channel having the multiple wires. Such a transmit driver may perform many different operations including filtering (which may also include digital filtering), frequency conversion (e.g., usually up-converting), conversion from the discrete-time digital domain to the continuous-time analog domain (e.g., using a DAC (Digital to Analog Converter)). Generally speaking, the operation for the transmit driver is to generate a continuous-time transmit signal that may be launched in the communication channel to which the communication device at this transmitter end of the communication channel is communicatively coupled. Also, in this context, the transmit driver is also operable to partition the signal into a number of signals that correspond to each of the multiple paths and/or wires of the noise channel 199. In this illustrated embodiment, the transmitted signal, s, 141 is launched into the n path communication channel that may be characterized as the noise channel 199.

At the receiver end of the n path communication channel that may be characterized as the noise channel 199, a received signal, y, 142 is generated from the continuous-time receive signal. Again, while one possible embodiment may include a 4 wire communication channel, other types of communication channels having more than 1 wire, channel, and/or path may also benefit from various aspects of the invention.

Generally speaking, a communication device at the receiver end of the communication channel is operable to perform appropriate front-end processing and subsequent decoding of the continuous-time receive signal with knowledge of the particular manner in which information bits and/or data 105 had been encoded and symbol mapped in the encoder 122 and the symbol mapper 124 within a communication device at the transmitter end of the communication channel.

Appropriate components may be implemented at the front end of the communication device at the receiver end of the communication channel to perform any requisite and appropriate filtering, frequency conversion (e.g., usually down-converting), demodulation, noise whitening, sampling, and/or any other necessary pre-processing to transform the signals received across the noise channel 199 into the received signal, y, 142. This received signal, y, 142 is also a construction of a single signal from each of the signal received from each of the multiple paths of the noise channel 199.

This received signal, y, 142 is then provided to a metric generator 175 that is operable to generate symbol metrics for each symbol within the received signal, y, 142. Each of the symbol metrics is then provided to a decoder 180 that is operable to make best estimates 110 of the information bits and/or the data 105 that have undergone the appropriate transmitter end processing, transmission across the noise channel 199 in the form of a continuous-time signal, and receiver end processing.

When considering a communication system that transmits information through m wires in a communication system, it may be supposed that among all of the m wires, there is one wire that has a relatively poor SNR (Signal to Noise Ratio) (e.g., $N_0$ dB (decibels)), and all other of the m−1 wires have the same SNR (e.g., N dB). Looking at one example, within a communication system comporting with the 4 wire communication channel within the emerging standard, IEEE 802.3an (10GBASE-T), m=4 and m−1=3. Section 55 of the IEEE 802.3an standard anticipates a 4 wire channel with non-equal SNR per channel will exist for 10G Ethernet transceivers.

If this supposition is correct (e.g., 1 wire having SNR of $N_0$ dB and the other wires having SNR of N dB), then the average SNR among all of the m wires may be provided as follows:

$$N_a = 10 \log\left( \frac{10^{(N_0/10)} + (m-1)10^{(N/10)}}{m} \right) dB \quad \text{(EQ 3)}$$

where the base of the logarithm is 10. One possible way to calculate the metric of a received signal is using this average SNR as shown above, $N_a$. By letting $\sigma_a^2$ be the variance of the noise that corresponds to the average SNR as shown above, $N_a$, then the metrics may be calculated as follows:

$$p_s(y \mid s) = \frac{1}{\sigma_a\sqrt{2\pi}} \exp\left(\frac{-1}{2a\sigma_a^2} D_{SE}(y, s)\right) \quad \text{(EQ 4)}$$

This is a modification of the (EQ 2) where $\sigma_a^2$, corresponding to the variance of the noise that corresponds to the average SNR, is used to replace $\sigma^2$. As can be seen, this metric may be viewed such that it is a product of a first term and a second term. The first term is inversely proportional to the standard deviation of the SNR ($\sigma$ or $\sigma_a$), and the second terms includes an exponent that is inversely proportional to each of the variance of the SNR ($\sigma^2$ or $\sigma_a^2$) and the amplification factor, a.

Figure 2:
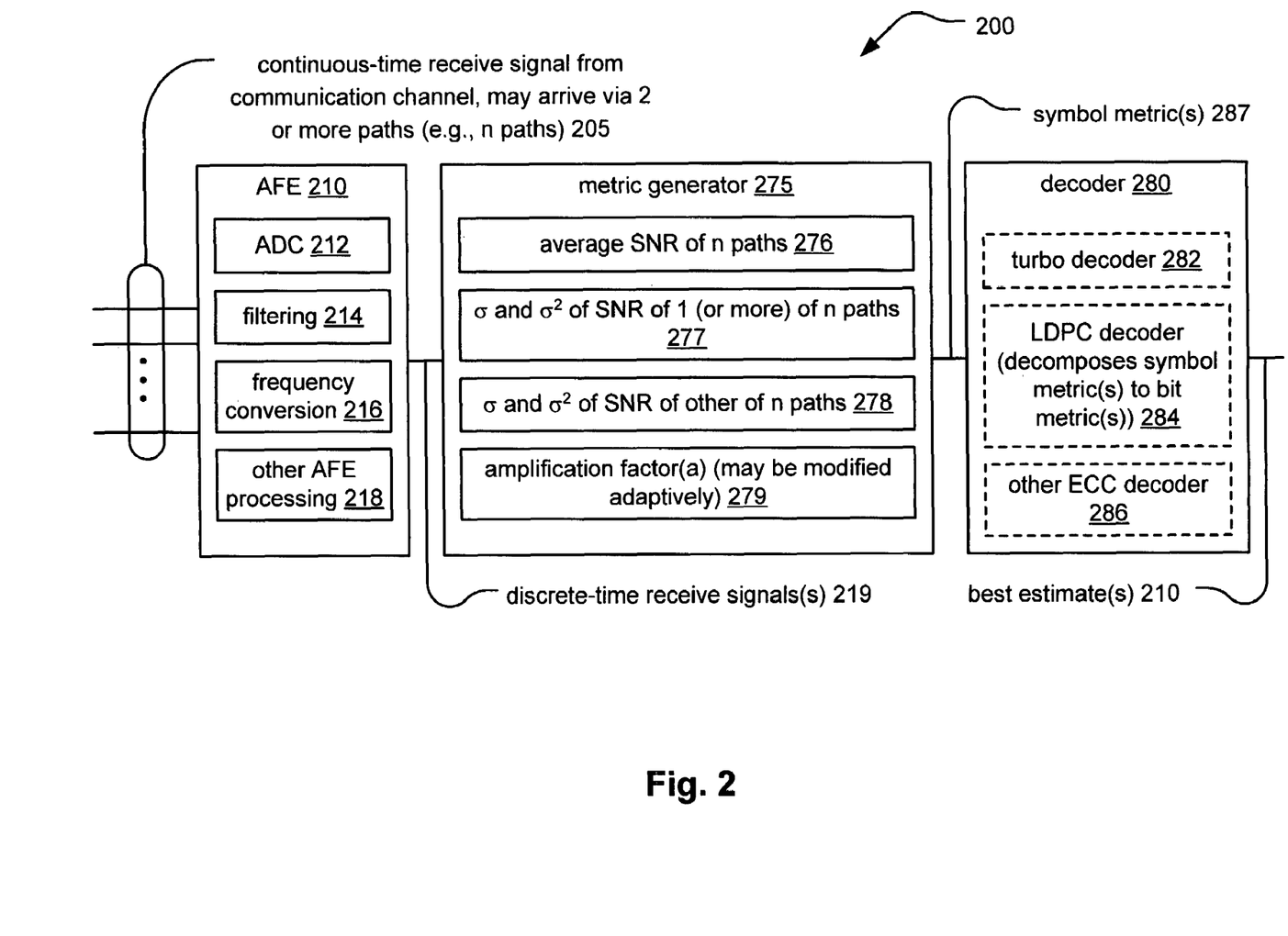
FIG. 2 is a diagram illustrating an embodiment of a communication device that may be built in accordance with certain aspects of the invention.

FIG. 2 is a diagram illustrating an embodiment of a communication device 200 that may be built in accordance with certain aspects of the invention. In some respects, this communication device 200 may be viewed as being situated at the receiver end of a communication channel. As shown by the reference numeral 205, a continuous-time receive signal is received from a communication channel. This continuous-time receive signal arrives via 2 or more paths (e.g., n paths). In some embodiments, these n paths correspond to 4 different wires of a 4 wire twisted pair cable.

This continuous-time receive signal is provided initially to an AFE (Analog Front End) 210. The AFE 210 is operable to perform initial processing operations on the continuous-time receive signal to generate discrete time receive signal(s) 219 that are then provided to a metric generator 275. The metric generator 275 is operable to transform discrete-time receive signals into a sequence of discrete-valued modulation symbols and to calculate symbol metrics 289 that correspond to the individual symbols of the that is operable to calculate symbol metrics 289.

These symbol metrics 289 are then provided to a decoder 280 that is operable to perform decoding of an ECC (Error Correcting Code) by which 1 or more information bits have been encoded thereby generating best estimates 210 of the sequence of discrete-valued modulation symbols and the information bits encoded therein.

The AFE 210 may be implemented to do a variety of processing operations on the continuous-time receive signal to generate discrete time receive signal(s) 219. These processing operations may include sampling (as may be performed using an ADC (Analog to Digital Converter) 212), filtering 214 (which may also include digital filtering), frequency conversion 216 (oftentimes down-conversion), and/or generally speaking, any other AFE processing 218.

The metric generator 275 is operable to calculate the average SNR of all of the n paths of the communication channel, as shown by the reference numeral 276. In addition, the metric generator 275 is operable to determine the variance ($\sigma^2$) and the standard deviation ($\sigma$) of the noise of 1 (or more) of the paths of the communication channel, as shown by the reference numeral 277. In some embodiments, this includes determining the variance ($\sigma^2$) and the standard deviation ($\sigma$) of the noise of only 1 of the paths of the communication channel. In addition, the metric generator 275 is operable to determine the variance ($\sigma^2$) and the standard deviation ($\sigma$) of the noise of each of the remaining paths of the communication channel, as shown by the reference numeral 278. In some embodiments, each of the remaining paths of the communication channel is presumed to have (or actually has) the same SNR. In such case, the variance ($\sigma^2$) and the standard deviation ($\sigma$) of the noise of only 1 of the remaining paths of the communication channel need be determined. Also, as described above, an amplification factor, a, may be employed when calculating the metrics. The use of this amplification factor, a, is shown with respect to the reference numeral 279, and this amplification factor, a, may also be adaptively modified in response to any of a variety of parameters including a change in the operating conditions (such as a change in SNR) or a change in environmental conditions.

The decoder 280 may be any error correcting decoder (i.e., any decoder that is operable to decode a signal that has been encoded using an ECC). For example, this decoder 280 may be a turbo decoder 282, an LDPC (Low Density Parity Check) decoder 284, or generically speaking, any ECC decoder 286. If the decoder 280 is implemented as an LDPC decoder 284, then the symbol metrics 287 need to be decomposed to bit metrics.

Figure 3:
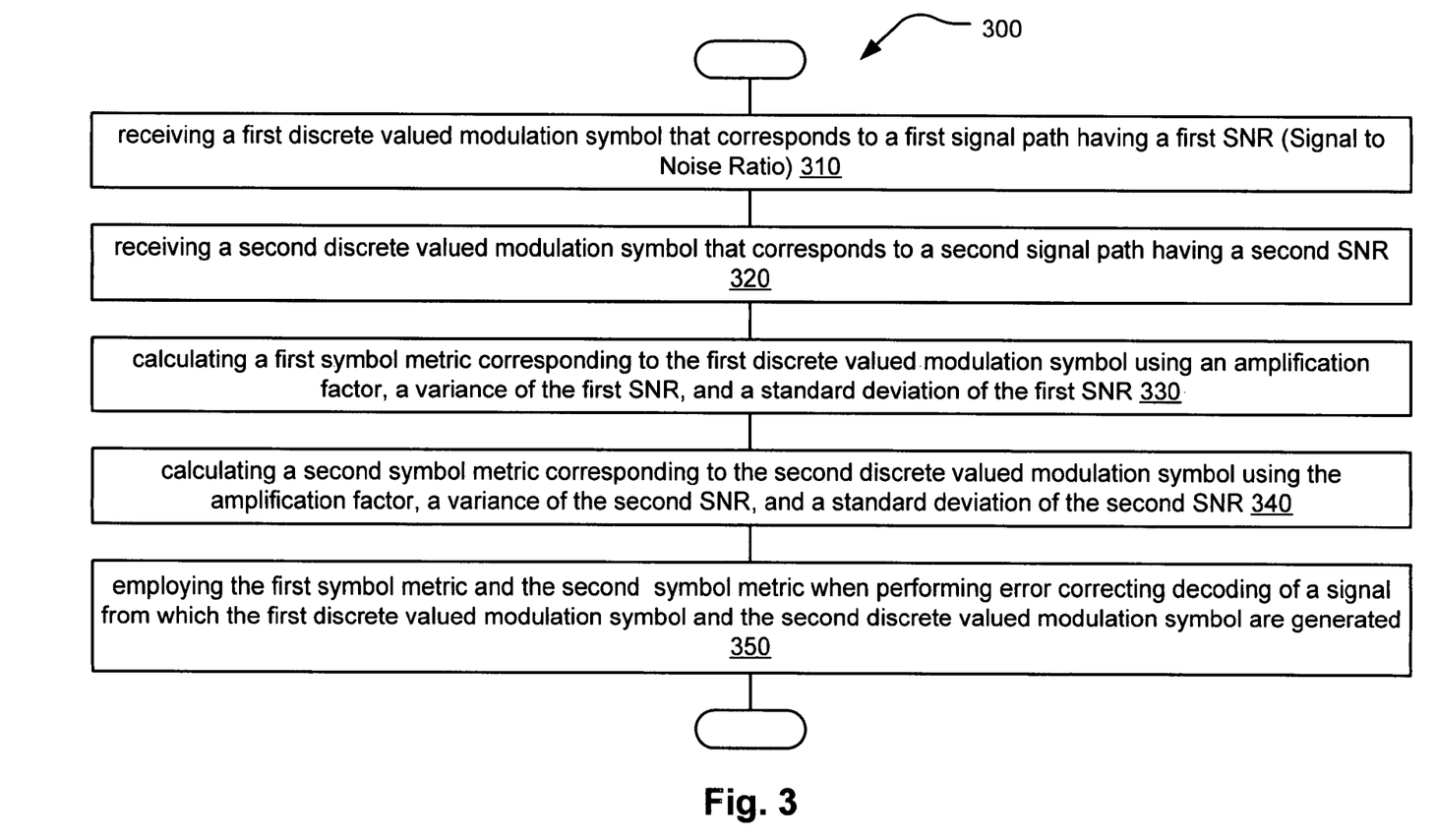
FIG. 3 is a diagram illustrating an embodiment of a method for calculating symbol metrics in accordance with certain aspects of the invention.

FIG. 3 is a diagram illustrating an embodiment of a method 300 for calculating symbol metrics in accordance with certain aspects of the invention. Initially, the method 300 begins by receiving a first discrete valued modulation symbol that corresponds to a first signal path having a first SNR (Signal to Noise Ratio), as shown in a block 310, and also receiving a second discrete valued modulation symbol that corresponds to a second signal path having a second SNR, as shown in a block 320.

The method 300 then continues by calculating a first symbol metric corresponding to the first discrete valued modulation symbol using an amplification factor, a variance of the first SNR, and a standard deviation of the first SNR, and the method 300 also continues by calculating a second symbol metric corresponding to the second discrete valued modulation symbol using the amplification factor, a variance of the second SNR, and a standard deviation of the second SNR. After these symbol metrics have been calculated, then the method 300 then continues by employing the first symbol metric and the second symbol metric when performing error correcting decoding of a signal from which the first discrete valued modulation symbol and the second discrete valued modulation symbol are generated.

Figure 4:
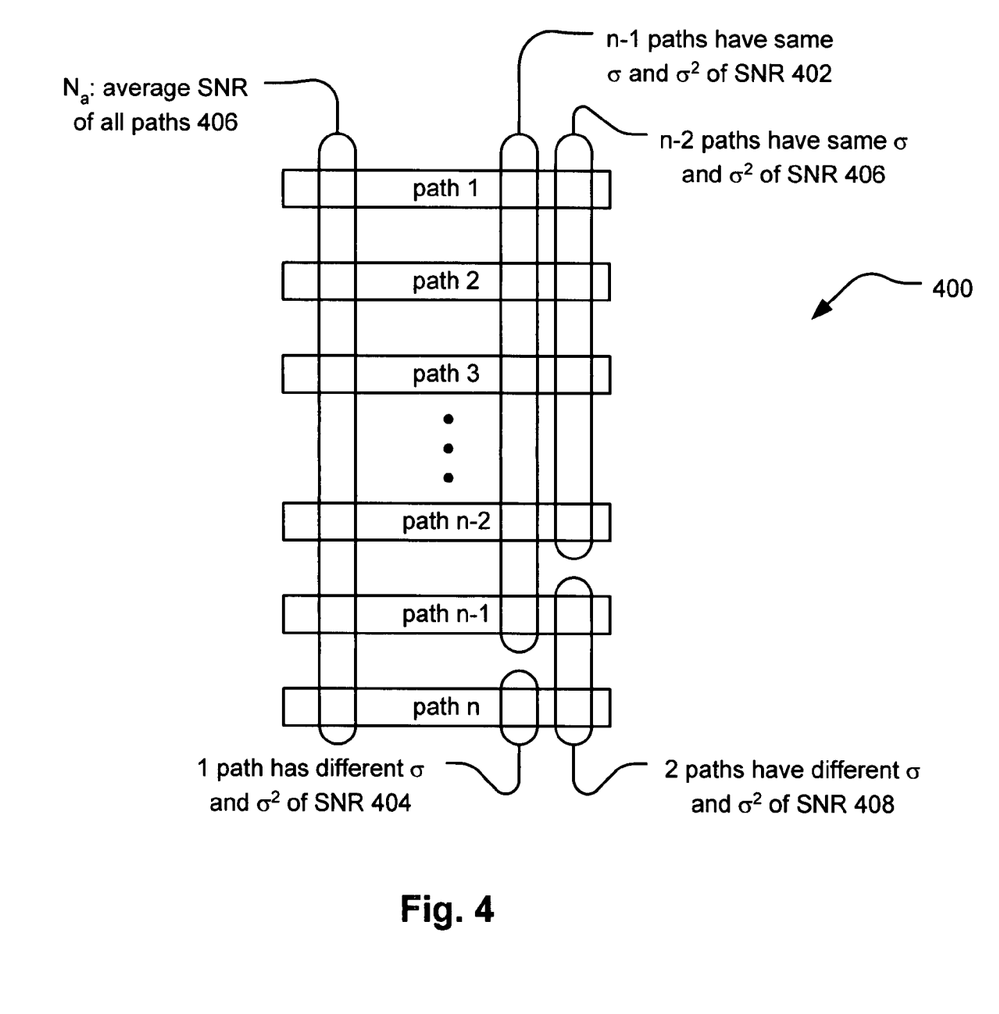
FIG. 4 is a diagram illustrating an embodiment of multi-path communication channel on which certain aspects of the invention may be applied.

FIG. 4 is a diagram illustrating an embodiment of multi-path communication channel 400 on which certain aspects of the invention may be applied. This multi-path communication channel 400 is shown as including n paths. The average SNR, $N_a$, is determined as function of all of the paths, and is shown by the reference numeral 406.

In one embodiment, it is presumed that n−1 of the paths have the same variance ($\sigma^2$) and the standard deviation ($\sigma$) of their corresponding SNR, as shown by the reference numeral 402, and the remaining 1 path has a different variance ($\sigma^2$) and the standard deviation ($\sigma$) of its corresponding SNR, as shown by the reference numeral 404.

In another embodiment, it is presumed that n−2 of the paths have the same variance ($\sigma^2$) and the standard deviation ($\sigma$) of their corresponding SNR, as shown by the reference numeral 406, and the remaining 2 paths have a different variance ($\sigma^2$) and the standard deviation ($\sigma$) of its corresponding SNR, as shown by the reference numeral 408.

This diagram provides the reader with a pictorial representation of manner by which the various paths of a multiple path communication channel may be divided up and one variance ($\sigma^2$) and the standard deviation ($\sigma$) of noise may correspond to a first subset of the paths, and a different variance ($\sigma^2$) and the standard deviation ($\sigma$) may correspond to a second subset of the paths. In one possible embodiment, the first subset of the paths includes exactly one path of the multiple path communication channel, and the second subset of the paths includes all of the remaining paths of the multiple path communication channel.

In this disclosure, the various performance diagrams are described in the context of BER (Bit Error Rate) versus $E_s/N_o$ (ratio of energy per signal to the Spectral Noise Density $N_o$). This term $E_s/N_o$ is the measure of SNR (Signal to Noise Ratio) for a digital communication system. When looking at these performance curves, the BER may be determined for any given $E_s/N_o$ (or SNR) thereby providing a relatively concise representation of the performance of the decoding approach.

Figure 5:
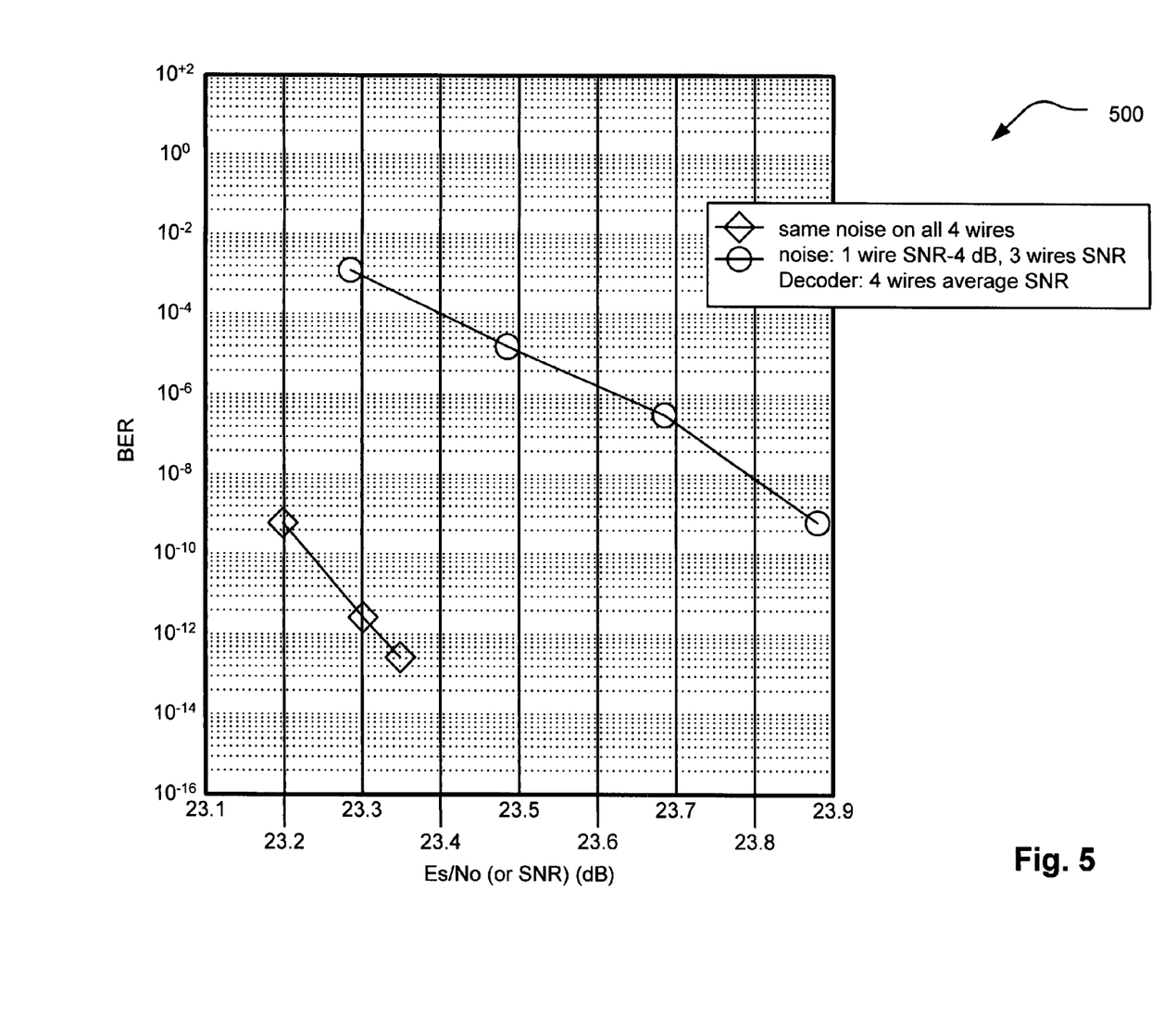
FIG. 5 is a diagram illustrating an embodiment of a performance comparison when using an average SNR (Signal to Noise Ratio) in accordance with certain aspects of the invention.

FIG. 5 is a diagram illustrating an embodiment of a performance comparison 500 when using an average SNR (Signal to Noise Ratio) in accordance with certain aspects of the invention. This performance comparison 500 corresponds to a decoder that is operable to decode a (2048, 1723) regular LDPC code that is described in the following reference, depicted by [1], using an 8-iteration MP (Message Passing) (or BP (Belief Propagation)) decoding approach. This reference [1] discloses and describes an LDPC code is constructed based on two codewords of an R-S (Reed-Solomon).

[1] I. Djurdjevic, J. Xu, K. Abdel-Ghaffar, and S. Lin, "A Class of Low-Density Parity-Check Codes Constructed Based on Reed-Solomon Codes with Two Information Symbols," *IEEE Communications Letters*, Vol. 7, No. 7, July 2003, pp. 317-319.

The constellation employed within the communication system whose performance is depicted by this performance comparison 500 is a DSQ (double square QAM) constellation described in the U.S. Provisional Application Ser. No. 60/604,426, which has been incorporated herein by reference in their entirety and made part of the present U.S. Utility Patent Application for all purposes, and to which priority has been claimed, as indicated above.

When employing such a DSQ constellation, the symbol mapping (sometimes referred to as signal mapping) maps 4 coded bits and 3 uncoded bits to one DSQ constellation point (e.g., to one DSQ signal, depicted by the total of 7 bits, 4 being coded bits and 3 being uncoded bits).

When considering one possible embodiment of the communication system 100 (such that the noise channel 199 includes 4 wires), it can be seen that the 4k+i-th signal is sent to the wire indexed by (i+1), where i=0,1,2,3. When considering 4 wire twisted pair cables that are used in such a 4 wire system (e.g., the IEEE 802.3an (10GBASE-T) emerging standard as one possible embodiment), it may be supposed that the first 3 wires have the same SNR (e.g., N dB) and the 4th wire has an SNR that is less than the first 3 wires (e.g., $N_0$=N−4 dB, such that $N_0$ is 4 dB less than N). When using the calculation presented above, in (EQ 3), for the average SNR and the metric calculation presented above, in (EQ 4), the performance comparison 500 may be achieved. As can be seen, there is a loss of 0.7 dB when compared to a multi-wire (or multi-channel and/or multi-path) communication channel having the same noise (e.g., even noise) on all of the wires.

In an actual communication system, it may be known which of the paths (or wires and/or paths) actually has the lower SNR among them. In such an instance, a different metric may be employed for the different signals received from each of the different wires. Such an approach is presented below with respect to a 4 wire system. However, these principles may also be extended to communication systems with even fewer or more wires as well without departing from the scope and spirit of the invention.

When considering a 4 wire twisted pair cable such that $N_0$=N−4 dB, then according to the (EQ 3), the average SNR is provided as follows:

$$N_a = 10\log\left(\frac{10^{(N_0/10)} + (m-1)10^{(N/10)}}{m}\right) = N - 0.708 \text{ dB}.$$

Using this, a better approach is presented herein for generating the metrics for an ECC (Error Correcting Code) decoder.

It may again be supposed that, $\sigma_a^2$, is the variance of the noise that corresponds to SNR, $N_a$. It may also be supposed that A and B are two non-negative numbers. These two numbers, A and B, may be viewed as being design parameters that may be employed when calculating symbol metrics. The variance of the SNR, $N_a$−A, may then be denoted as, $\sigma_A^2$, and the variance of the SNR, $N_a$+B, may then be denoted as, $\sigma_B^2$.

Using this approach, the metrics may then be computed as follows:

$$p_s(y_{4k+i} \mid s) = \frac{1}{\sigma_A \sqrt{2\pi}} \exp\left(\frac{-1}{2a\sigma_A^2} D_{SE}(y_{4k+i}, s)\right) \quad \text{(EQ 5)}$$

for $i$ = 0, 1, 2, and $$p_s(y_{4k+3} \mid s) = \frac{1}{\sigma_B \sqrt{2\pi}} \exp\left(\frac{-1}{2a\sigma_B^2} D_{SE}(y_{4k+3}, s)\right) \quad \text{(EQ 6)}$$

for $k$ = 0, 1, ...

Figure 6:
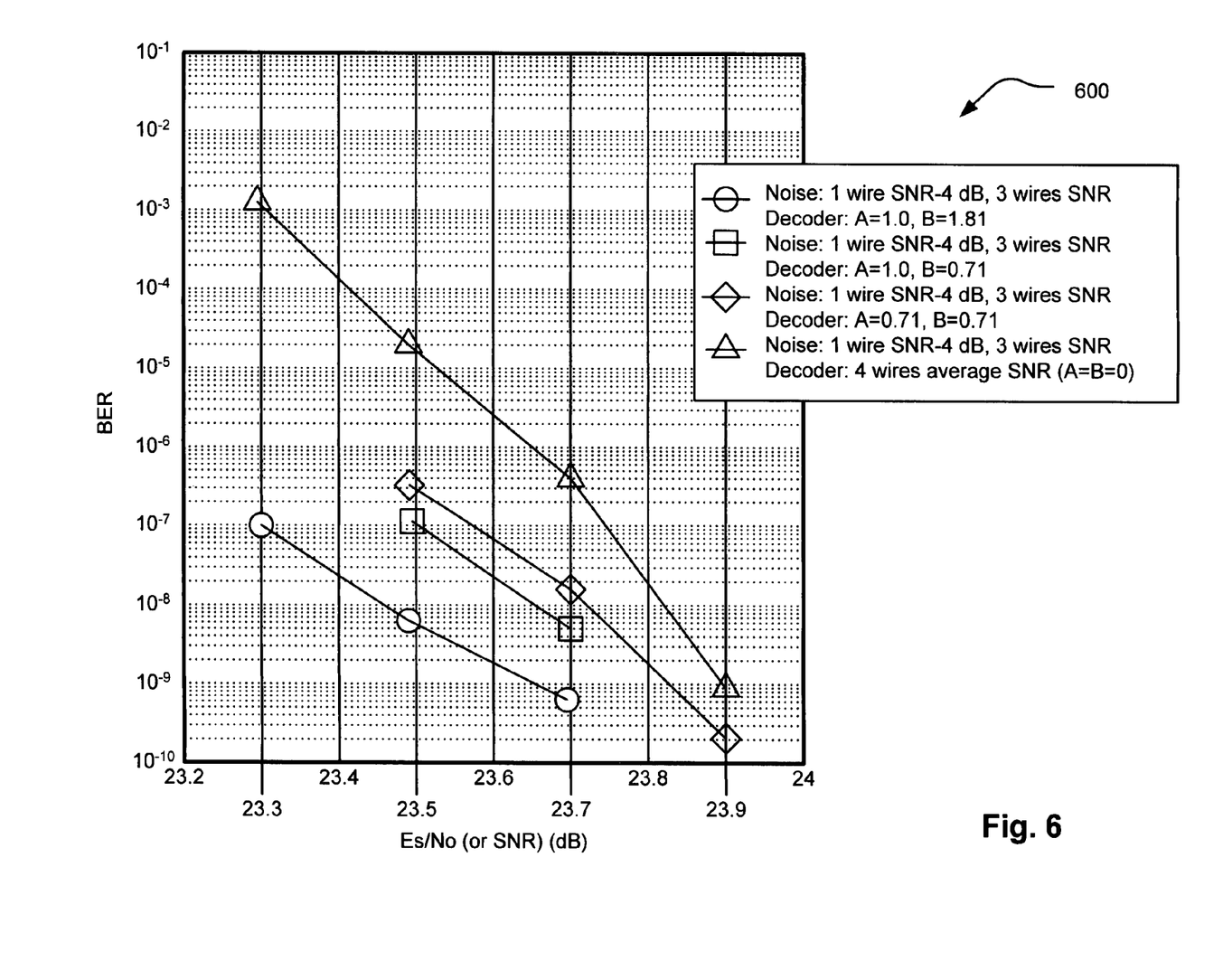
FIG. 6 is a diagram illustrating an embodiment of a performance comparison when employing different values of values A and B in accordance with certain aspects of the invention.

FIG. 6 is a diagram illustrating an embodiment of a performance comparison 600 when employing different values of values A and B in accordance with certain aspects of the invention. This performance comparison 600 shows the performance of a communication device (implemented at the receiver end of a communication channel) that is operable to perform metric calculations using the values of A and B in accordance with the approach presented above.

Using this approach, it can be seen that a gain of 0.3 dB may be achieved.

Generally speaking, it may be supposed that there are m wires total within a communication channel. Among these m wires, it may also be supposed that among them there are n<m wires (e.g., wires $i_0, \ldots, i_{n-1}$) that have an SNR of N dB, and there are m−n wires (e.g., wires $j_0, \ldots, j_{m-n-1}$) that have an SNR of N−$n_l$ dB, for l=0, ..., m−n−1. It may then be supposed that $N_a$ is the average SNR, as calculated by (EQ 6), and its corresponding noise variance is depicted as, $\sigma_a^2$. It may then also be supposed that A and $B_0, \ldots, B_{m-n-1}$ are m−n+1 non-negative numbers.

Therefore, the variance of the SNR, $N_a$−A, may then be denoted as, $\sigma_A^2$, and the variance of the SNR, $N_a$+$B_l$, may then be denoted as, $\sigma_{B_l}^1$.

Using this now modified approach, the metrics may then be computed using the generalized approach that is presented as follows:

$$p_s(y_{mk+i_l} \mid s) = \frac{1}{\sigma_A \sqrt{2\pi}} \exp\left(\frac{-1}{2a\sigma_A^2} D_{SE}(y_{mk+i_l}, s)\right) \quad \text{(EQ 7)}$$

for $l$ = 0, ..., $n$ − 1, and $$p_s(y_{mk+j_l} \mid s) = \frac{1}{\sigma_{B_l} \sqrt{2\pi}} \exp\left(\frac{-1}{2a\sigma_{B_l}^2} D_{SE}(y_{mk+j_l}, s)\right) \quad \text{(EQ 8)}$$

for $l$ = 0, ..., $m - n - 1$, where $k$ = 0, 1, ...

It is also noted that the methods described within the preceding figures may also be performed within any of the appropriate system and/or apparatus designs (e.g., communication systems, communication transmitters, communication receivers, communication transceivers, and/or functionality described therein) that are described above without departing from the scope and spirit of the invention.

Moreover, it is also noted that the various functionality, system and/or apparatus designs, and method related embodiments that are described herein may all be implemented in the logarithmic domain (e.g., log domain) thereby enabling multiplication operations to be performed using addition and division operations to be performed using subtraction.

In view of the above detailed description of the invention and associated drawings, other modifications and variations will now become apparent. It should also be apparent that such other modifications and variations may be effected without departing from the spirit and scope of the invention.

What is claimed is:

1. A metric generator implemented within a communication device, the metric generator comprising:
    an input that is operable to:
        receive a first discrete valued modulation symbol that corresponds to a first signal path having a first SNR (Signal to Noise Ratio); and
        receive a second discrete valued modulation symbol that corresponds to a second signal path having a second SNR;
    a metric calculation functional block that is operable to:
        calculate a first symbol metric corresponding to the first discrete valued modulation symbol using an amplification factor, a variance of the first SNR, and a standard deviation of the first SNR; and
        calculate a second symbol metric corresponding to the second discrete valued modulation symbol using the amplification factor, a variance of the second SNR, and a standard deviation of the second SNR; and
    an output that is operable to provide the first symbol metric and the second symbol metric to an ECC (Error Correcting Code) decoder.

2. The metric generator of claim 1, wherein:
the first symbol metric is a product of a first term and a second term;
the first term is inversely proportional to the standard deviation of the first SNR; and
an exponent of the second term is inversely proportional to each of the variance of the first SNR and the amplification factor.

3. The metric generator of claim 1, wherein:
the input is operable to receive a third discrete valued modulation symbol that corresponds to a third signal path having the second SNR; and
the metric calculation functional block is operable to calculate a third symbol metric corresponding to the third discrete valued modulation symbol using the amplification factor, the variance of the second SNR, and the standard deviation of the second SNR.

4. The metric generator of claim 1, wherein:
the metric generator is implemented within a communication receiver that is operable to receive a signal transmitted via a plurality of signal paths that comprises the first signal path and the second signal path; and
the plurality of signal paths comprises 4 wires within a 4 wire twisted pair cable that is communicatively coupled to the communication receiver.

5. The metric generator of claim 4, wherein:
3 wires within the 4 wire twisted pair cable comprise the first SNR; and
1 wire within the 4 wire twisted pair cable comprises the second SNR.

6. The metric generator of claim 1, wherein:
an average SNR corresponds to the first signal path and the second signal path;
the variance of the first SNR is a difference between the average SNR and a first value; and
the variance of the second SNR is a sum of the average SNR and a second value.

7. The metric generator of claim 1, wherein:
the ECC decoder is a turbo decoder.

8. The metric generator of claim 1, wherein:
the ECC decoder is an LDPC (Low Density Parity Check) decoder;
the LDPC decoder is operable to:
    decompose the first symbol metric into a first plurality of bit metrics; and
    decompose the second symbol metric into a second plurality of bit metrics.

9. The metric generator of claim 1, wherein:
the metric generator is implemented within a communication receiver that is operable to receive a signal transmitted via a plurality of signal paths that comprises the first signal path and the second signal path;
the first signal path has the first SNR;
the second signal path has the second SNR; and
each remaining signal path within the plurality of signal paths has the second SNR.

10. The metric generator of claim 1, wherein:
the metric calculation functional block modifies the amplification factor in response to a change in at least one of the first SNR and the second SNR.

11. A metric generator implemented within a communication device, the metric generator comprising:
    an input that is operable to:
        receive a first discrete valued modulation symbol that corresponds to a first signal path having a first SNR (Signal to Noise Ratio);
        receive a second discrete valued modulation symbol that corresponds to a second signal path having a second SNR;
        receive a third discrete valued modulation symbol that corresponds to a third signal path having the second SNR; and
        receive a fourth discrete valued modulation symbol that corresponds to a fourth signal path having the second SNR;
    a metric calculation functional block that is operable to:
        calculate a first symbol metric corresponding to the first discrete valued modulation symbol using an amplification factor, a variance of the first SNR, and a standard deviation of the first SNR; and
        calculate a second symbol metric corresponding to the second discrete valued modulation symbol using the amplification factor, a variance of the second SNR, and a standard deviation of the second SNR;
        calculate a third symbol metric corresponding to the third discrete valued modulation symbol using the amplification factor, the variance of the second SNR, and the standard deviation of the second SNR;
        calculate a fourth symbol metric corresponding to the fourth discrete valued modulation symbol using the amplification factor, the variance of the second SNR, and the standard deviation of the second SNR; and an output that is operable to provide the first symbol metric and the second symbol metric to an ECC (Error Correcting Code) decoder.

12. The metric generator of claim 11, wherein:
the first symbol metric is a product of a first term and a second term;
the first term is inversely proportional to the standard deviation of the first SNR; and
an exponent of the second term is inversely proportional to each of the variance of the first SNR and the amplification factor.

13. The metric generator of claim 11, wherein:
the first signal path is a first wire within a 4 wire twisted pair cable;
the second signal path is a second wire within the 4 wire twisted pair cable;
the third signal path is a third wire within the 4 wire twisted pair cable; and
the fourth signal path is a fourth wire within the 4 wire twisted pair cable.

14. The metric generator of claim 11, wherein:
an average SNR corresponds to the first signal path, the second signal path, the third signal path, and the fourth signal path;
the variance of the first SNR is a difference between the average SNR and a first value; and
the variance of the second SNR is a sum of the average SNR and a second value.

15. A method for calculating symbol metrics, the method comprising:
receiving a first discrete valued modulation symbol that corresponds to a first signal path having a first SNR (Signal to Noise Ratio);
receiving a second discrete valued modulation symbol that corresponds to a second signal path having a second SNR;
calculating a first symbol metric corresponding to the first discrete valued modulation symbol using an amplification factor, a variance of the first SNR, and a standard deviation of the first SNR;
calculating a second symbol metric corresponding to the second discrete valued modulation symbol using the amplification factor, a variance of the second SNR, and a standard deviation of the second SNR; and
within a decoder, employing the first symbol metric and the second symbol metric when performing error correcting decoding of a signal from which the first discrete valued modulation symbol and the second discrete valued modulation symbol are generated.

16. The method of claim 15, wherein:
the first symbol metric is a product of a first term and a second term;
the first term is inversely proportional to the standard deviation of the first SNR; and
an exponent of the second term is inversely proportional to each of the variance of the first SNR and the amplification factor.

17. The method of claim 15, further comprising:
receiving a third discrete valued modulation symbol that corresponds to a third signal path having the second SNR; and
calculating a third symbol metric corresponding to the third discrete valued modulation symbol using the amplification factor, the variance of the second SNR, and the standard deviation of the second SNR.

18. The method of claim 15, wherein:
an average SNR corresponds to the first signal path and the second signal path;
the variance of the first SNR is a difference between the average SNR and a first value; and
the variance of the second SNR is a sum of the average SNR and a second value.

19. The method of claim 15, wherein:
the signal is an LDPC (Low Density Parity Check) coded signal; and further comprising:
decomposing the first symbol metric into a first plurality of bit metrics; and
decomposing the second symbol metric into a second plurality of bit metrics.

20. The method of claim 15, further comprising:
modifying the amplification factor in response to a change in at least one of the first SNR and the second SNR.

21. A communication device, comprising:
an AFE (analog front end) that is operable to:
receive a continuous-time receive signal from a communication channel that comprises a plurality of wires, wherein a first subset of the plurality of wires comprises a variance of a first SNR (Signal to Noise Ratio) and a standard deviation of the first SNR, and wherein a second subset of the plurality of wires comprises a second SNR and a standard deviation of the second SNR; and
convert the continuous-time receive signal into a discrete-time signal using means to perform at least one of continuous-time filtering, ADC (analog-to-digital conversion), and discrete-time filtering, thereby obtaining a first plurality of discrete-time receive signals at a modulation rate that corresponds to the first subset of the plurality of wires, and thereby obtaining a second plurality of discrete-time receive signals at the modulation rate that correspond to the second subset of the plurality of wires;
a metric generator that is operable to:
transform the first plurality of discrete-time receive signals and the second first plurality of discrete-time receive signals into a sequence of discrete-valued modulation symbols that comprises a first plurality of discrete-valued modulation symbols that corresponds to the first subset of the plurality of wires and a second plurality of discrete-valued modulation symbols that corresponds to the second subset of the plurality of wires;
calculate a first plurality of symbol metrics that corresponds to at least one discrete-valued modulation symbol of the first plurality of discrete-valued modulation symbols using an amplification factor, the variance of the first SNR, and the standard deviation of the first SNR; and
calculate a second plurality of symbol metrics that corresponds to at least one discrete-valued modulation symbol of the second plurality of discrete-valued modulation symbols using the amplification factor, the variance of the second SNR, and the standard deviation of the second SNR; and
a decoder that is operable to employ the first plurality of symbol metrics and the second plurality of symbol metrics when performing error correction decoding of the first plurality of discrete-time receive signals and the second plurality of discrete-time receive signals thereby generating best estimates of the sequence of discrete-valued modulation symbols and the information bits encoded therein.

22. The communication device of claim 21, wherein:

each symbol metric of the first plurality of symbol metrics is a product of a first term and a second term;

the first term is inversely proportional to the standard deviation of the first SNR; and an exponent of the second term is inversely proportional to each of the variance of the first SNR and the amplification factor.

23. The communication device of claim 21, wherein:

the plurality of wires comprises a 4 wire twisted pair cable;

3 wires within the 4 wire twisted pair cable comprise the first SNR; and 1 wire within the 4 wire twisted pair cable comprises the second SNR.

24. The communication device of claim 21, wherein:

an average SNR corresponds to the plurality of wires;

the variance of the first SNR is a difference between the average SNR and a first value; and the variance of the second SNR is a sum of the average SNR and a second value.

25. The communication device of claim 21, wherein:

the decoder is a turbo decoder.

26. The communication device of claim 21, wherein:

the decoder is an LDPC (Low Density Parity Check) decoder;

the LDPC decoder is operable to:

decompose at least one symbol metric within the first plurality of symbol metrics into a first plurality of bit metrics; and decompose at least one symbol metric within the second plurality of symbol metrics into a second plurality of bit metrics.

* * * * *